United States Patent
Tsujino et al.

(10) Patent No.: US 6,366,517 B1
(45) Date of Patent: *Apr. 2, 2002

(54) SEMICONDUCTOR INTEGRATED CIRCUIT CAPABLE OF READILY ADJUSTING CIRCUIT CHARACTERISTIC

(75) Inventors: Mitsunori Tsujino; Goro Hayakawa, both of Hyogo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/062,590

(22) Filed: Apr. 20, 1998

(30) Foreign Application Priority Data

Dec. 25, 1997 (JP) ............................................. 9-357643

(51) Int. Cl.[7] ................................................. G11C 7/00
(52) U.S. Cl. ..................... 365/225.7; 365/222
(58) Field of Search ....................... 365/225.7, 222.236, 365/200, 201, 225

(56) References Cited

U.S. PATENT DOCUMENTS

| 5,311,476 A | 5/1994 | Kajimoto et al. ........... 365/222 |
|---|---|---|
| 5,410,510 A | 4/1995 | Smith et al. ................. 365/201 |
| 5,449,214 A * | 9/1995 | Mori et al. .................. 365/222 |
| 5,471,431 A * | 11/1995 | McClure .................... 365/225.7 |
| 5,774,404 A * | 6/1998 | Eto ............................. 365/222 |
| 5,812,466 A * | 9/1998 | Lee et al. .................... 365/200 |
| 5,812,475 A * | 9/1998 | Lee et al. ..................... 365/22 |

FOREIGN PATENT DOCUMENTS

| JP | 5-2878 | 1/1993 |
|---|---|---|
| JP | 5-189960 | 7/1993 |
| JP | 9-91961 | 4/1997 |

\* cited by examiner

*Primary Examiner*—David Nelms
*Assistant Examiner*—David Lam
(74) *Attorney, Agent, or Firm*—McDermott, Will & Emery

(57) ABSTRACT

A semiconductor integrated circuit includes: first and second counters activated upon receipt of a low level signal and outputting a signal with a period which is twice that of the signal input; first fuse circuits connected to first counters; and a second fuse circuit connected to second counter. First counters are inactivated when fuses included in first fuse circuits are disconnected, and second counter is activated when a fuse included in second fuse circuit is disconnected. Thus, the period of a signal for determining a refresh period can be efficiently adjusted. Here, the arrangement of first fuse circuits and a second fuse circuit can be converse.

10 Claims, 4 Drawing Sheets

SEMICONDUCTOR INTEGRATED CIRCUIT CAPABLE OF READILY ADJUSTING CIRCUIT CHARACTERISTIC

BACKGROUND OF THE INVENTION

1. Field of the Invention

The present invention relates to semiconductor integrated circuits, and more specifically to a semiconductor integrated circuit including a fuse circuit.

2. Description of the Background Art

FIG. 3 is a block diagram showing an overall structure of a conventional semiconductor memory device. Referring to FIG. 3, the semiconductor memory device has normal operation and self refresh modes, and includes: a WE (Write Enable) buffer 1; a CAS (Column Address Strobe) buffer 3; a column address buffer 5; a column decoder 7 connected to column address buffer 5; an RAS (Row Address Strobe) buffer 9; a row address buffer 11 connected to RAS buffer 9; a row decoder 13 connected to row address buffer 11; a memory cell array 15; a sense amplifier 17; an I/O circuit 19 connected to sense amplifier 17; a self refresh switching circuit 21 an internal address generation circuit 23 connected to RAS buffer 9 and self refresh switching circuit 21 an address input terminal 20; a switch 22; and a refresh period determination circuit 25 connected to self refresh switching circuit 21.

Here, refresh period determination circuit 25 includes a ring oscillator 250 and a frequency divider 251 connected thereto.

Recently, with higher degree of integration and the speed of LSIs (Large Scale Integrations) including a dynamic random access memory (DRAM), a compact peripheral circuit portion is increasingly becoming an important factor to increase not only the degree of integration of a memory cell but also the space for the memory cell to occupy. In this context, interconnection pitch for the peripheral circuit portion is reduced. Therefore, it is a significant matter to reduce the number of defective products due to mis-blowing in the manufacture of fuse circuits adjusting periods such as refresh cycles by fuse blowing, And, to reduce the times of mis-blowing is effective for shortening the adjusting time.

FIG. 4 is a diagram showing a structure of the conventional frequency divider 251 shown in FIG. 3. Referring to FIG. 4, frequency divider 251 includes: a power supply node 30; a ground node 32; a counter 34; a counter 35 connected to counter 34; a counter 36 connected to counter 35; a fuse circuit 37 connected to counter 35; a fuse circuit 38 connected to counter 36; and an inverter 39.

Here, fuse circuit 37 includes: a high resistance element 371; a node n1; a fuse 372; and an N channel MOS transistor 373 having its gate supplied with a high level signal Sg. Fuse circuit 38 includes: a high resistance element 381; a node n2; a fuse 382; and an N channel MOS transistor 383.

Each of counters 34 to 36 outputs a signal with a period which is twice that of an input signal /CNTE when input signal /CNTE is activated to a low level, but directly outputs the input signal /CNTE when it is inactivated to a high level.

Thus, frequency divider 251 is structured such that a period of a signal REFSE output from frequency divider 251 is reduced by disconnecting fuses 372 and 382.

In other words, in an initial state in which both of fuses 372 and 382 are connected to the respective fuse circuits, N channel MOS transistors 373 and 383 included in fuse circuits 37 and 38 are on, so that signals /CNTE which have been activated to the low level are supplied for counters 35 and 36 from fuse circuits 37 and 38, respectively.

Then, both of counters 35 and 36 output signals with periods which are twice those of the input signals.

Here, assuming that only fuse 372 is disconnected, for example, signal /CNTE which has been inactivated to the high level is supplied for counter 35 from node n1 included in fuse circuit 37, so that counter 35 directly outputs an input signal OUT1 as a signal OUT2 with its period unchanged. Accordingly, when only fuse 372 is disconnected, signal REFSE is output from frequency divider 251 having a period which is one half that obtained when fuse circuit 372 is not disconnected.

It is noted that counter 34 never fails to output signal OUT1 with a period which is twice that of an input signal IN, and counters 34 to 36 are reset when an inverted signal RESET of a signal BBUE is activated to the high level.

In the above mentioned semiconductor memory device, however, the circuit is generally structured to afford a sufficient margin for a duration of a refresh period. Thus, the refresh period must be adjusted by disconnecting a fuse by laser blow. The operation of disconnecting by laser blow requires a prescribed time, and may disadvantageously produces defective circuits by mis-blowing.

SUMMARY OF THE INVENTION

An object of the present invention is to provide a semiconductor integrated circuit which allows reduction in the required disconnection times by laser blow in adjusting a refresh period to complete a good product.

According to one aspect of the present invention, the semiconductor integrated circuit includes: a first circuit; a second circuit connected to the first circuit; a first fuse circuit connected to the first circuit for generating a first activation signal activating the first circuit in the initial state and generating a first inactivation signal inactivating the first circuit when a first fuse included therein is disconnected; and a second fuse circuit connected to the second circuit for generating a second inactivation signal inactivating the second circuit in the initial state and generating a second activation signal activating the second circuit when a second fuse included therein is disconnected.

According to another aspect of the present invention, the semiconductor integrated circuit includes an oscillation circuit and an adjuster for increasing or decreasing oscillation frequency for the oscillation circuit by disconnecting at least one fuse.

Accordingly, an advantage of the present invention is to allow more efficient initial setting of the semiconductor integrated circuit by disconnecting the fuse.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
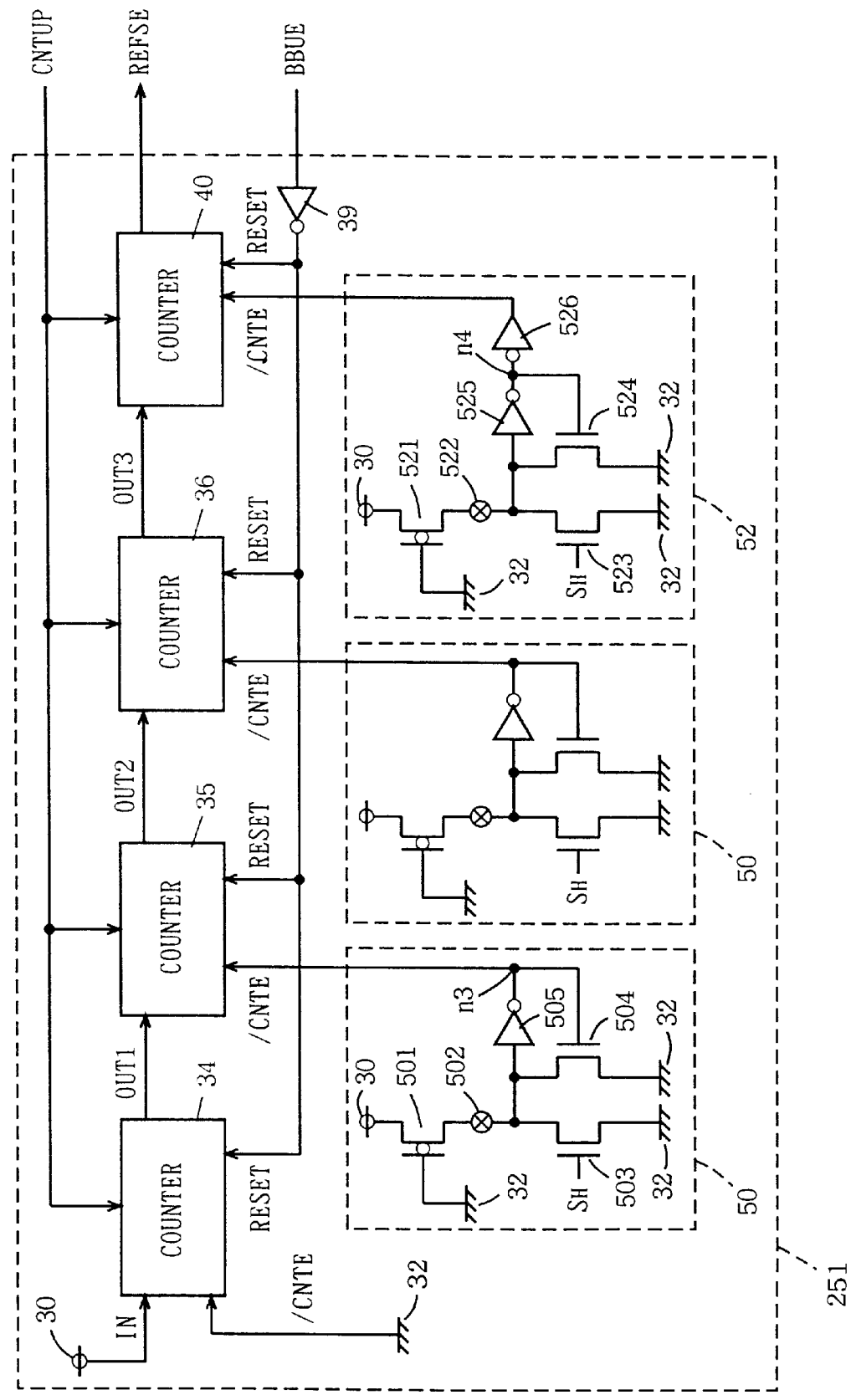
FIG. 1 is a diagram showing a structure of a frequency divider in accordance with an embodiment of the present invention.

Now, the embodiment of the present invention will be described in detail referring to the drawings. It is noted that the same or corresponding portions are denoted by the same reference numerals.

Figure 2:
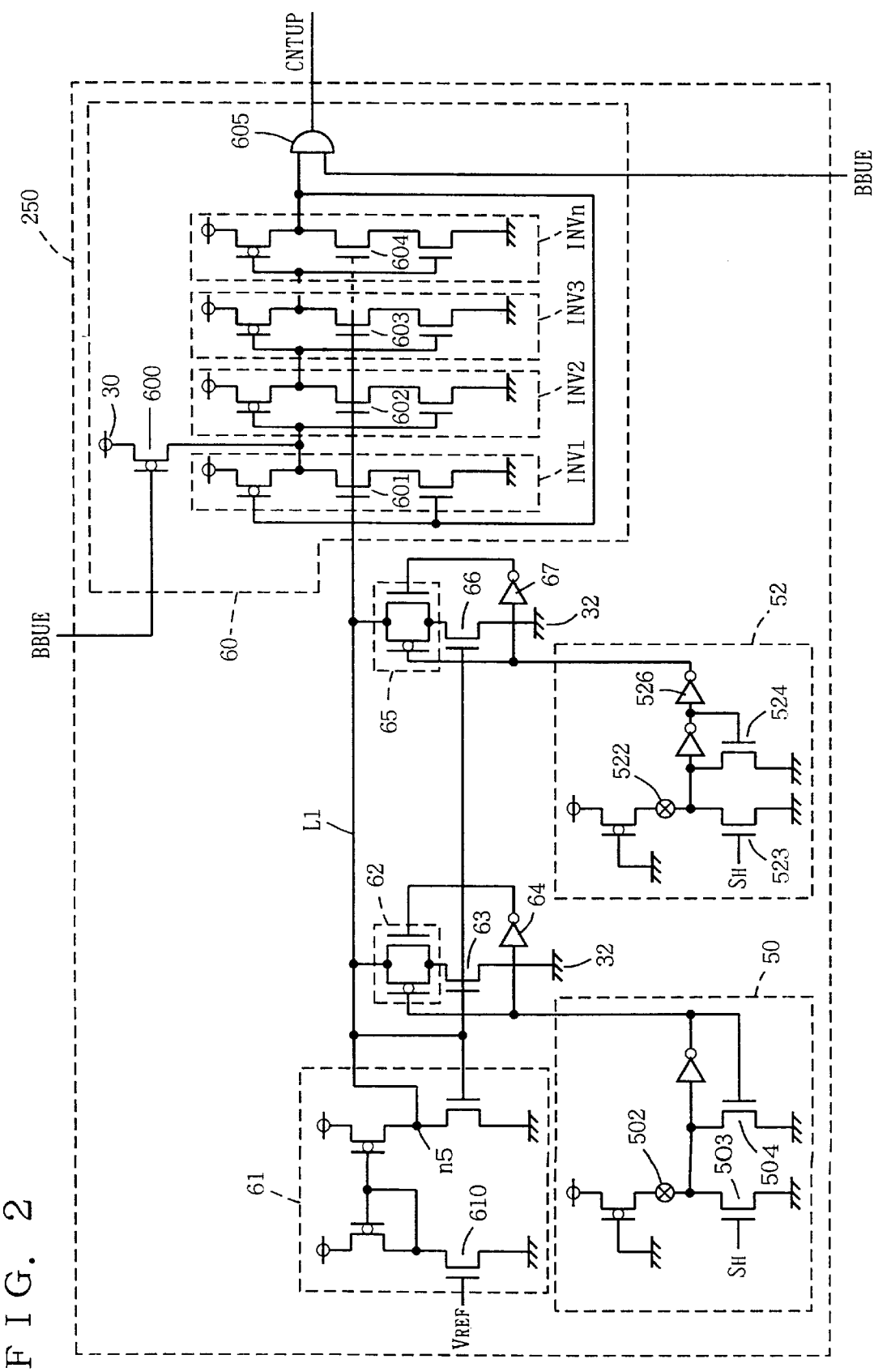
FIG. 2 is a diagram showing a structure of a ring oscillator in accordance with the embodiment of the present invention.
Figure 3:
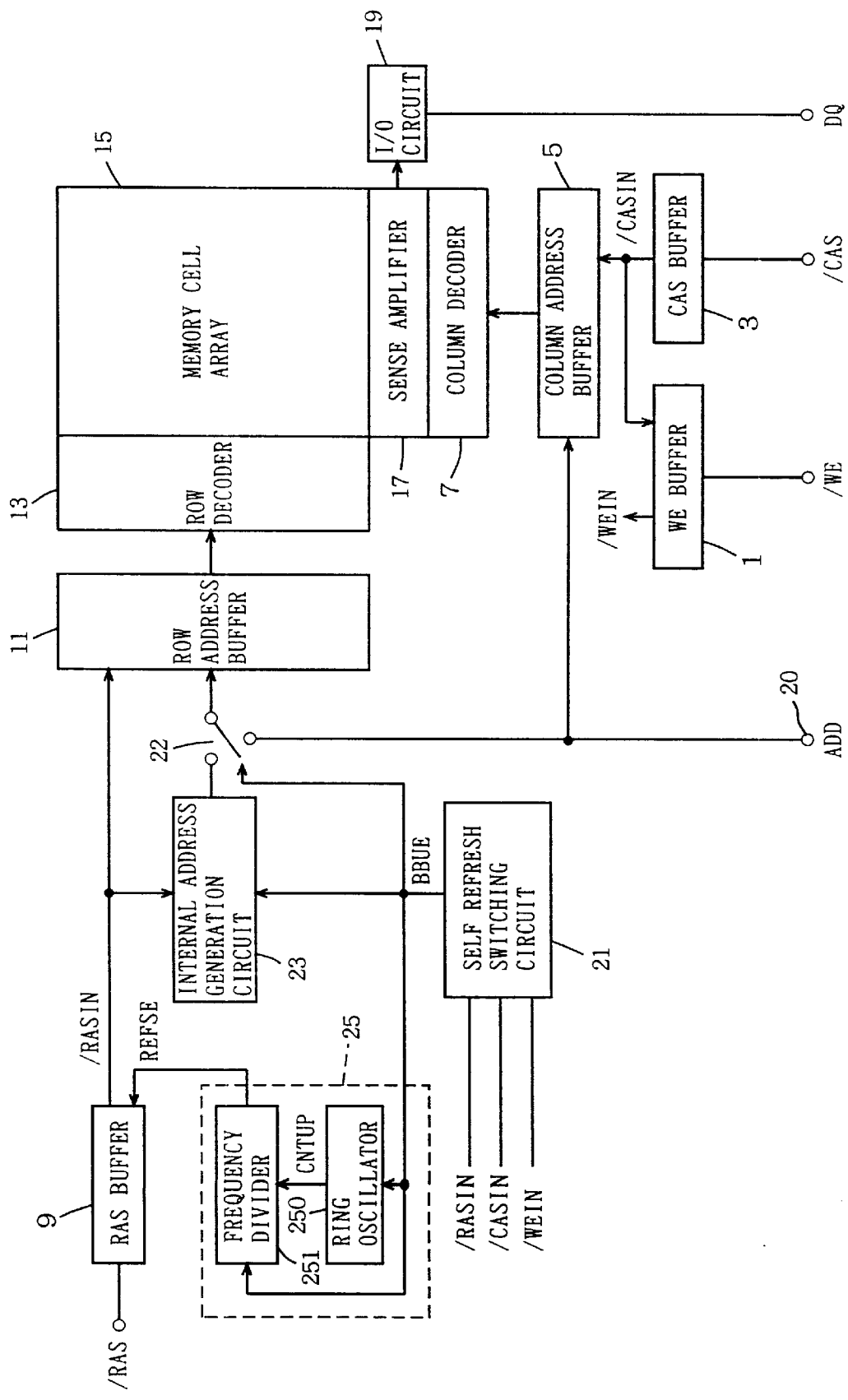
FIG. 3 is a diagram showing the overall structure of the conventional semiconductor memory device.

The semiconductor memory device in accordance with the embodiment of the present invention is similar to that shown in FIG. 3, but is different in that frequency divider 251 and a ring oscillator 250 are respectively as shown in FIGS. 1 and 2.

Referring to FIG. 1, frequency divider 251 according to the embodiment of the present invention includes: a power supply node 30; a ground node 32; a counter 34; a counter 35 connected to counter 34; a counter 36 connected to counter 35; a counter 40 connected to counter 36; fuse circuits 50 respectively connected to counters 35 and 36; a fuse circuit 52 connected to counter 40; and an inverter 39 supplying an inverted signal RESET of a supplied signal BBUE for counters 34 to 36 and 40.

Fuse circuit 50 includes: a fuse 502; a P channel MOS transistor 501 connected between a fuse 502 and power supply node 30 and having its gate supplied with ground voltage; an N channel MOS transistor 503 connected between fuse 502 and ground node 32 and having its gate supplied with a high level signal $S_H$; a node n3 connected to counter 35; an N channel MOS transistor 504 connected between fuse 502 and ground node 32 and having its gate connected to node n3; and an inverter 505 having its input end connected to drains of N channel MOS transistors 503 and 504 and its output end connected to node n3.

Fuse circuit 52 includes: a fuse 522; a P channel MOS transistor 521 connected between fuse 522 and power supply node 30 and having its gate supplied with ground voltage; an N channel MOS transistor 523 connected between fuse 522 and ground node 32 and having its gate supplied with high level signal $S_H$; a node n4; an inverter 526 having its output end connected to counter 40 and input end connected to node n4; an N channel MOS transistor 524 connected between fuse 522 and ground node 32 and having its gate connected to node n4; and an inverter 525 having its input end connected to drains of N channel MOS transistors 523 and 524, and its output end connected to node n4.

The operation of frequency divider 251 will now be described.

Fuse circuits 50 supply activated low level signals /CNTE for counters 35 and 36 as high level signals CNTE are supplied from power supply nodes 30 for inverters 505 in the initial state in which fuses 502 are not disconnected. In addition, fuse circuits 50 supply inactivated high level signals /CNTE for counters 35 and 36 as low level signals CNTE are supplied for inverters 505 in the state in which fuses 502 are disconnected and thus N channel MOS transistors 503 remain on.

On the other hand, fuse circuit 52 supplies an inactivated high level signal /CNTE from inverter 526 for counter 40 as a high level signal is supplied from power supply node 30 for inverter 525 in the initial state in which fuse 522 is not disconnected. In addition, fuse circuit 52 supplies an activated low level signal /CNTE for counter 40 as a low level signal is supplied for inverter 525 in the state in which fuse 522 is disconnected and thus N channel MOS transistor 523 remains on.

Here, each of counters 34 to 36 and 40 are activated by the supply of activated low level signals /CNTE and inactivated by the supply of inactivated high level signals /CNTE from corresponding fuse circuits 50 and 52. Each of counters 34 to 36 and 40 outputs a signal with a period which is twice that for a signal input in the active state, but directly outputs the signal input with its period unchanged in the inactive state.

It is noted that counter 34 never fails to receive activated low level signal /CNTE.

Thus, in the initial state in which all of fuses 502 and 521 are connected to the respective circuits, counters 34 to 36 are activated and counter 40 is inactivated. Therefore, at this time, counter 34 outputs a signal OUT1 with a period which is twice that of an input signal IN, counter 35 outputs a signal OUT2 with a period which is twice that of input signal OUT1, counter 36 outputs a signal OUT3 with a period which is twice that of input signal OUT2, but counter 40 directly outputs input signal OUT3 as signal REFSE with its period unchanged. Accordingly, signal REFSE with a period which is eight times that of input signal IN is output through initial setting of frequency divider 251.

A signal CNTUP is supplied for each of counters 34 to 36 and 40 from ring oscillator 250, and controls the operation of the counter. In addition, inverted signal RESET of signal BBUE, which is to attain the high level in self refresh mode, is supplied for each of counters 34 to 36 and 40 from inverter 39. Each of counters 34 to 36 and 40 are reset when signal RESET attains the high level, that is, when signal RESET is brought into normal operation mode.

It is noted that signal BBUE is activated to the high level when a self refresh switching circuit 21 switches the semiconductor memory device to the self refresh mode by detecting a so-called CBR timing at which a signal /WEIN is at the high level and a signal /CASIN is activated prior to a signal /RASIN.

With frequency divider 251 having the above mentioned structure, a period (a refresh period) of output signal REFSE can be reduced by disconnecting fuse 502 and a period of output signal REFSE is increased by disconnecting fuse 522. More specifically, in the initial setting, while frequency divider 251 outputs signal REFSE with a period which is eight times that of signal IN, frequency divider 251 can output signal REFSE with a period which is four times that of signal IN if one fuse 502 in fuse circuit 50, connected to counter 35, is disconnected. Meanwhile, frequency divider 251 outputs signal REFSE with a period which is sixteen times that of signal IN if fuse 522 is disconnected.

Here, the initial setting is most desirably achieved such that the period of output signal REFSE corresponds to the expected value of the refresh period. Then, disconnection of the fuse by laser blow is not required. However, fuses 502 and 522 are respectively disconnected when refresh periods which are shorter and longer than the initial setting value are desired. On the other hand, the conventional frequency divider 521 shown in FIG. 4 always requires disconnection of the fuse by laser blow for setting the refresh period, and can only reduce the refresh period by disconnection of fuses 372 and 382.

Figure 4:
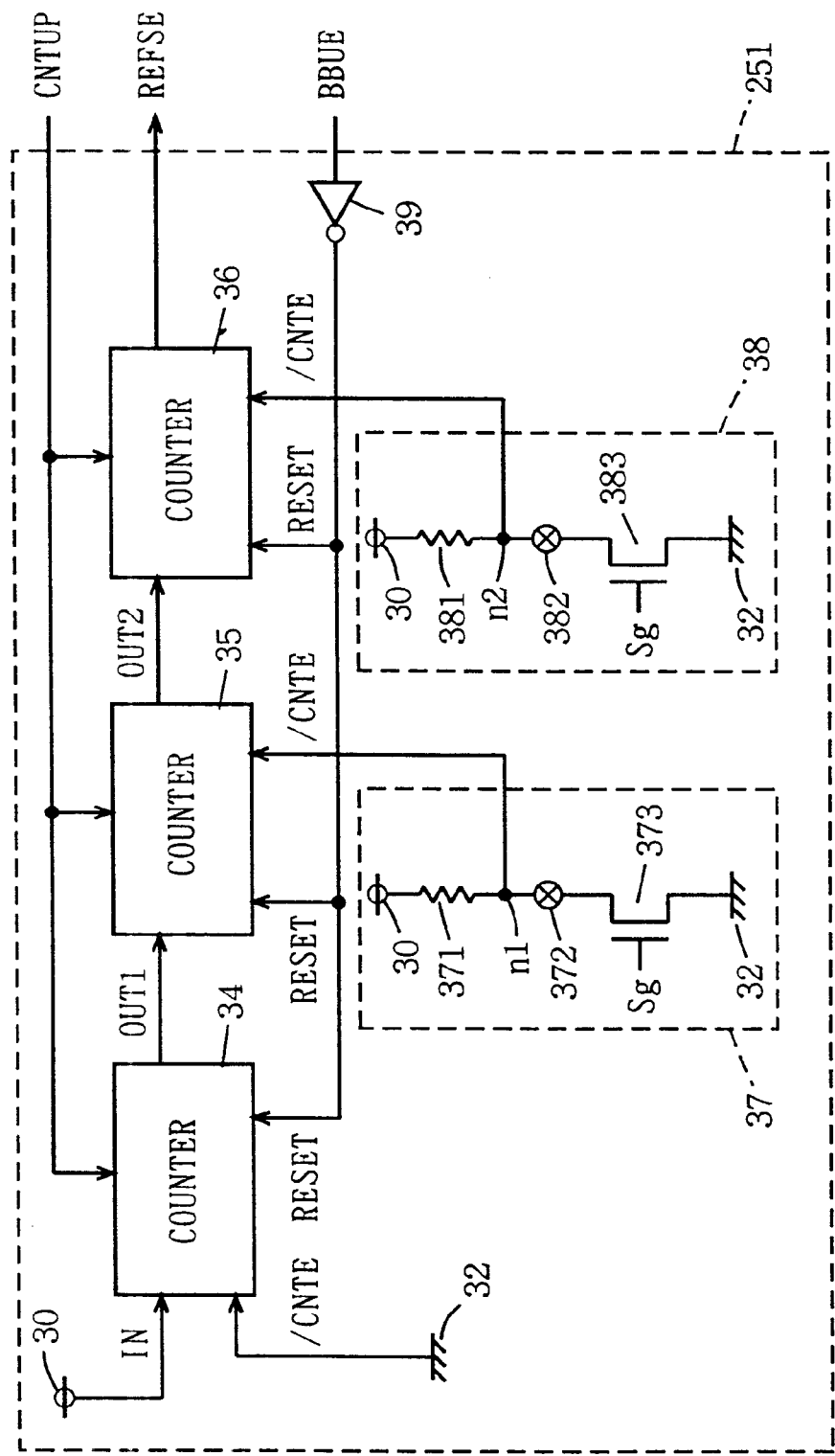
FIG. 4 is a diagram showing the structure of a frequency divider shown in FIG. 3.

Therefore, though the conventional frequency divider 251 shown in FIG. 4 can only reduce the refresh period by fuse blow, frequency divider 251 shown in FIG. 1 of the present embodiment can reduce or increase the refresh period by fuse blow, so that the number of times for laser blow operation can be reduced. As a result, the time required for laser blow as well as occurrence of defective circuits due to mis-blowing can be reduced.

It is noted that signal REFSE output from frequency divider 251 is supplied for an RAS buffer 9, and timing for incorporating a signal /RAS in the self refresh mode (refresh period) is determined. In the self refresh mode, an internal address is generated in an internal address generation circuit 23 in accordance with signal /RASIN and supplied for a row address buffer 11.

In FIG. 1, the arrangement of first fuse circuits 50 and a second fuse circuit 52 can be converse.

FIG. 2 is a circuit diagram showing a structure of ring oscillator 250 in accordance with the present embodiment. Referring to FIG. 2, ring oscillator 250 includes: an oscillation circuit 60; a signal line L1; a current mirror circuit 61 connected to oscillation circuit 60 through signal line L1; a transfer gate 62 connected to signal line L1; an N channel MOS transistor 63 connected between transfer gate 62 and ground node 32; an inverter 64; a fuse circuit 50 switching on/off of transfer gate 62; a transfer gate 65 connected to signal line L1; an N channel MOS transistor 66 connected between transfer gate 65 and ground node 32; an inverter 67; and a fuse circuit 52 switching on/off of transfer gate 65.

Here, oscillation circuit 60 includes: an inverter chain having n inverters INV1 to INVn; a P channel MOS transistor 600 having its gate supplied with signal BBUE and performing initial setting of the inverter chain; and an AND circuit 605 taking a logical product of an output signal from inverter INVn and signal BBUE, and supplying signal CNTUP for frequency divider 251. Inverters INV1 to INVn have N channel MOS transistors 601 to 604 having their gates connected to signal line L1, respectively.

Current mirror circuit 61 includes a node n5 connected to signal line L1, and an N channel MOS transistor 610 having its gate supplied with voltage VREE.

It is noted that fuse circuits 50 and 52 have the same structure as fuse circuits 50 and 52 shown in FIG. 1, respectively.

The operation of ring oscillator 250 will now be described.

In the normal operation mode, inactivated low level signal BBUE is supplied for the gate of P channel MOS transistor 600 from a self refresh switching circuit 21 so that P channel MOS transistor 600 is turned on and potential at an output node of inverter INV1 is fixed at the high level. Thus, ring oscillator 250 is not oscillated in the normal operation mode. At the same time, in the normal operation mode, AND circuit 605 is inactivated and low level signal CNTUP is supplied for frequency divider 251.

On the other hand, in the self refresh mode, self refresh switching circuit 21 generates high level signal BBUE, so that P channel MOS transistor 600 is turned off and ring oscillator 250 starts oscillation. AND circuit 605 is also activated and an output signal from inverter INVn is supplied for frequency divider 251 as signal CNTUP.

Here, oscillation frequency for ring oscillator 250 is determined by the flow rate of operation current (response rate) of inverters INV1 to INVn. The response rate depends on how strongly N channel MOS transistors 601 to 604, respectively included in inverters INV1 to INVn, turn on, and how strongly N channel MOS transistors 601 to 604 turn on is determined by the potential of signal line L1. In addition, the potential of signal line L1 depends on the magnitude of output current from node n5 included in current mirror circuit 61, and the magnitude of output current is determined by the degree of voltage $V_{REF}$ supplied for the gate of N channel MOS transistor 610.

Fuse circuit 50 reduces the potential of signal line L1 for turning on transfer gate 62 in the initial state in which fuse 502 is connected, and maintains the potential of signal line L1 for turning off transfer gate 62 in the state in which fuse 502 is disconnected. On the other hand, fuse circuit 52 maintains the potential of signal line L1 for turning off transfer gate 65 in the initial state in which fuse 522 is connected, and reduces the potential of signal line L1 for turning on transfer gate 65 in the state in which fuse 522 is disconnected.

Therefore, ring oscillator 250 with such structure is most desirably designed such that the potential of signal line L1 corresponds to the expected value allowing generation of signal CNTUP having a desired period in the initial state. Fuse 52 is disconnected when a longer period is desired for signal CNTUP, and fuse 502 is disconnected when a shorter period is desired for signal CNTUP.

In view of the above, ring oscillator 250 in accordance with the present embodiment can adjust potential of signal line L1 and control oscillation frequency by disconnecting fuses 502 and 522.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit for adjusting a refresh period, comprising:
    a first circuit;
    a second circuit connected to said first circuit;
    a first fuse circuit connected to said first circuit for generating a first activation signal activating said first circuit in an initial state and generating a first inactivation signal inactivating said first circuit when a first fuse included therein is disconnected; and
    a second fuse circuit connected to said second circuit for generating an inverted second inactivation signal inactivating said second circuit in the initial state and generating an inverted second activation signal activating said second circuit when a second fuse included therein is disconnected.

2. The semiconductor integrated circuit according to claim 1, wherein
    said first circuit is a count circuit for changing a period of an input signal upon receipt of said first activation signal, and
    said second circuit is a count circuit for changing a period of an input signal upon receipt of said second activation signal.

3. The semiconductor integrated circuit according to claim 2, wherein said first fuse circuit includes:
    said first fuse;
    a power supply node connected to said first fuse;
    a first output node connected to said first fuse;
    a ground node; and
    a first transistor connected between said first output node and said ground node; and said second fuse circuit includes:
    said second fuse;
    said power supply node connected to said second fuse;
    a second output node connected to said second fuse;
    an inverter connected between said second output node and said second circuit;
    said ground node; and
    a second transistor connected between said second output node and said ground node.

4. A semiconductor integrated circuit, comprising:

oscillation means; and adjusting means for increasing or decreasing oscillation frequency of said oscillation means by blowing at least one fuse, said adjusting means including:
  (a) a first fuse circuit including:
    a first output node,
    a first fuse connected between said first output node and a power supply node, and
    a first transistor connected between said first output node and a ground node, and
  (b) a second fuse circuit including:
    a second output node,
    a second fuse connected between said second output node and said power supply node,
    an inverter connected to said second output node, and
    a second transistor connected between said second output node and said ground node.

5. The semiconductor integrated circuit according to claim 4, wherein said oscillation means includes an inverter chain having a plurality of inverters, and said adjusting means increases or decreases operation current for each of said inverters.

6. The semiconductor integrated circuit according to claim 5, wherein said adjusting means further includes a constant current generation circuit, said first fuse circuit reduces an output potential of said constant current generation circuit by a first prescribed value in an initial state and maintains said output potential by blowing said first fuse, and said second fuse circuit maintains said output potential in the initial state and reduces said output potential by a second prescribed value by blowing said second fuse, said operational current being increased or decreased in accordance with said output potential.

7. A semiconductor integrated circuit, comprising:

a plurality of counters connected in series; and an adjusting circuit capable of selectively increasing and decreasing the number of active counters among said plurality of counters by correspondingly blowing at least one fuse.

8. The semiconductor integrated circuit according to claim 7, wherein said adjusting circuit including:

a first fuse circuit connected to one of said counters for generating a first activation signal activating said one counter in an initial state and generating a first inactivation signal inactivating said one counter when a first fuse included therein is disconnected; and a second fuse circuit connected to another one of said counters for generating an inverted second inactivation signal inactivating said another one counter in the initial state and generating an inverted second activation signal activating said another one counter when a second fuse included therein is disconnected.

9. A frequency divider comprising:

a plurality of counters connected in series and generating a signal;

a first circuit increasing a period of the signal to be generated by said plurality of counters by blowing a fuse; and a second circuit decreasing the period of the signal to be generated by said plurality of counters by blowing a fuse.

10. The frequency divider according to claim 9, wherein said frequency divider is used for a refresh operation of a dynamic random access memory.

* * * * *